US005552733A

United States Patent [19]

Lesmeister

[11] Patent Number: 5,552,733
[45] Date of Patent: *Sep. 3, 1996

[54] PRECISE AND AGILE TIMING SIGNAL GENERATOR BASED ON A RETRIGGERED OSCILLATOR

[75] Inventor: Gary J. Lesmeister, Hayward, Calif.

[73] Assignee: Credence Systems Corporation, Fremont, Calif.

[*] Notice: The term of this patent shall not extend beyond the expiration date of Pat. No. 5,345,186.

[21] Appl. No.: 493,238

[22] Filed: Jun. 20, 1995

Related U.S. Application Data

[63] Continuation-in-part of Ser. No. 301,274, Sep. 6, 1994, which is a continuation of Ser. No. 5,651, Jan. 19, 1993, Pat. No. 5,345,186.

[51] Int. Cl.[6] .............................. H03K 5/26; H03L 7/087
[52] U.S. Cl. ........................ 327/295; 327/100; 327/113; 327/105; 327/269; 327/261; 327/156; 331/1 A
[58] Field of Search ................................ 327/105, 113, 327/261, 263, 100, 114, 120, 269, 296, 295, 147, 156, 163, 270; 331/1 A, 25, 57

[56] References Cited

U.S. PATENT DOCUMENTS

| 4,091,335 | 5/1978 | Giolma | 331/1 A |
|---|---|---|---|
| 4,173,722 | 11/1979 | Detering | 327/291 |
| 4,242,754 | 12/1980 | DePouilly et al. | 327/141 |
| 4,244,043 | 1/1981 | Fujita et al. | 331/57 |
| 4,508,974 | 4/1985 | Henderson | 307/66 |
| 4,902,986 | 2/1990 | Lesmeister | 331/25 |
| 4,912,433 | 3/1990 | Motegi et al. | 322/261 |
| 4,954,824 | 9/1990 | Yamada et al. | 364/724.1 |
| 5,028,888 | 7/1991 | Ray | 322/101 |
| 5,059,924 | 10/1991 | JenningsCheck | 331/1 A |
| 5,068,628 | 11/1991 | Ghoshal | 331/1 A |
| 5,075,640 | 12/1991 | Miyazawa | 331/25 |
| 5,077,529 | 12/1991 | Ghoshal | 327/272 |
| 5,136,260 | 9/1992 | Yousefi-Elezei | 331/1 A |
| 5,233,314 | 8/1993 | McDermott et al. | 331/1 A |
| 5,233,316 | 8/1993 | Yamada et al. | 331/1 A |
| 5,451,911 | 9/1995 | Colvin et al. | 327/295 |

Primary Examiner—Timothy P. Callahan
Assistant Examiner—Dinh T. Le
Attorney, Agent, or Firm—Smith-Hill and Bedell

[57] ABSTRACT

A timing signal generator produces a timing signal having one or more pulses of adjustable phase relative to pulses of a stable reference clock. The timing signal generator employs a low jitter retriggerable oscillator to produce a set of tap signals. The tap signals are frequency locked to the reference clock signal but are evenly distributed in phase. The timing signal generator times the pulses of its output timing signal using pulses of the various tap signals as timing references. Each cycle of the oscillator is triggered by a pulse of the reference clock signal to minimize timing signal jitter. Phase lock loops frequency lock the tap signals to the reference clock and ensure predictability of the timing signal pulse timing relative to the reference clock signal.

16 Claims, 6 Drawing Sheets

PRECISE AND AGILE TIMING SIGNAL GENERATOR BASED ON A RETRIGGERED OSCILLATOR

CROSS-REFERENCE TO RELATED APPLICATIONS

The present application is a continuation-in-part of co-pending U.S. patent application Ser. No. 08/301,274 filed Sep. 6, 1994 which is a continuation of U.S. patent application 08/005,651 filed Jan. 19, 1993 and issued Sep. 6, 1994 as U.S. Pat. No. 5,346,186.

BACKGROUND OF THE INVENTION

1. Field of the Invention

The present invention relates in general to systems for generating a timing signal and in particular to a timing system employing a retriggered voltage controlled oscillator for reducing jitter.

2. Description of Related Art

The present invention relates to a timing signal generator useful, for example, for synchronizing in an integrated circuit (IC) tester. An IC chip typically has pads on its surface providing access points for its input and output signals. The IC's pins are connected to these pads when the chip is packaged. However before the integrated circuit (IC) is packaged it can be tested by an integrated circuit tester having a set of probes for contacting the IC's pads. To test an IC the tester transmits input signals to various nodes of the device under test (DUT) and samples various output signals produced at nodes of the DUT in response to the input signals. In a distributed tester architecture, the tester employs a separate "node processor" for each test node of the DUT. Each node processor is a separate integrated circuit and handles signal transmission and sampling for its node. Since the timing of input signal transmission and output signal sampling is critical, a clock signal is sent in common to each node processor and each node processor includes a timing signal generator for controlling the timing of signal transmission and sampling using the clock signal as a timing reference.

U.S. Pat. No. 4,902,986 issued Feb. 20, 1990 to Gary Lesmeister describes a prior art timing signal generator similar to that illustrated herein at FIG. 1. Timing signal generator 10 generates a TIMING signal 12 having pulses occurring at desired times relative to assertion of a START signal 14. Timing circuit 10 includes a free-running ring oscillator 16 consisting of a set of N identical inverter stages S1 through SN connected in series to form a ring. Each inverter stage S1–SN has a similar signal propagation delay D. When N is an odd number, the taps TA(1)–TA(N) at the nodes between the inverter inputs and outputs oscillate with a period that is 2×N×D at 50% duty cycle. Although the tap signals TA(1)–TA(N) are all of the same frequency they are shifted in phase one from another by 2×D, or twice the stage propagation delay. The leading edges of pulses of tap signals TA(1)–TA(N) are thus evenly distributed in time and serve to divide the oscillator period of 2×N×D into N equal time slots.

Figure 1:
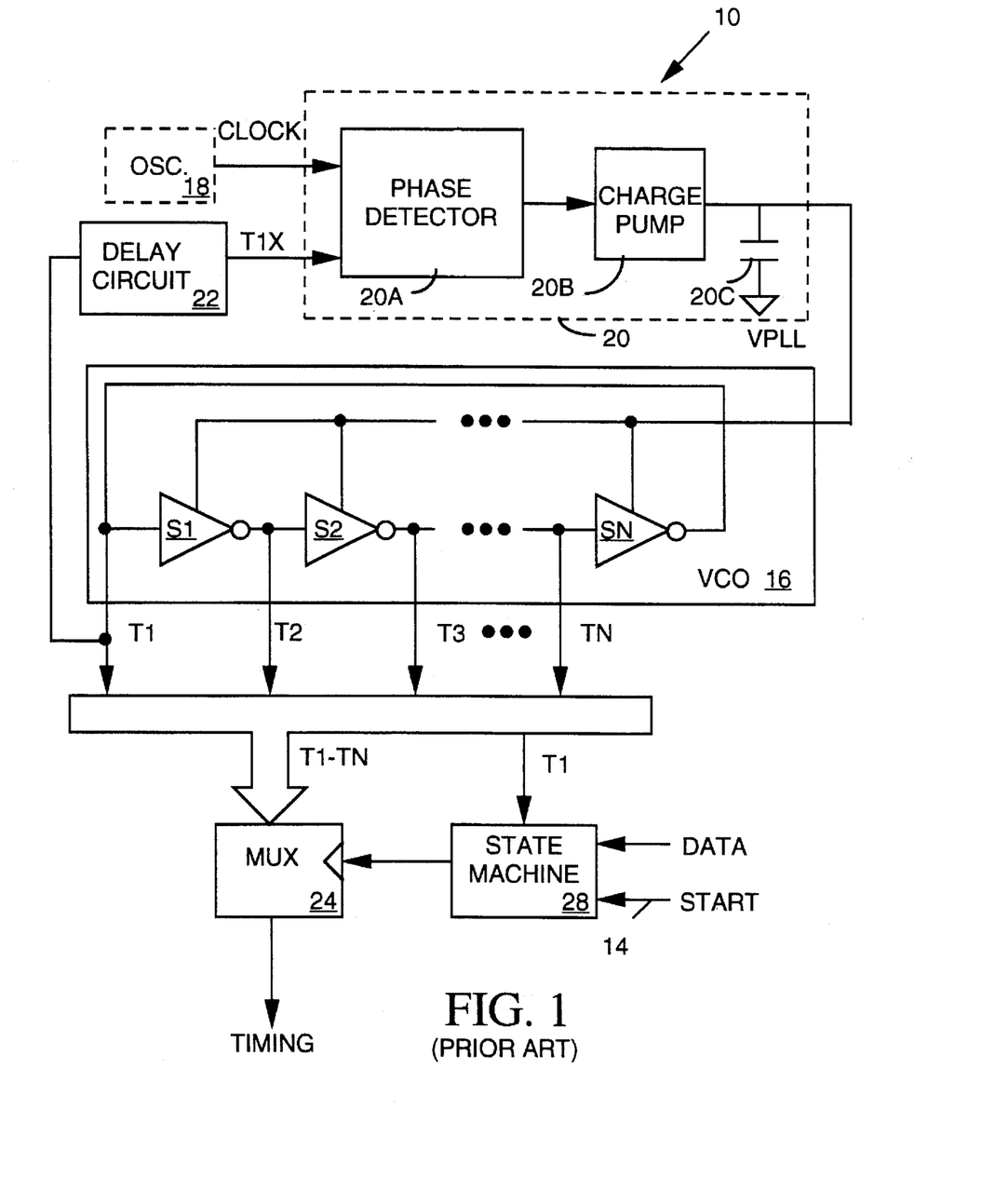
FIG. 1 illustrates a prior art timing signal generator in block diagram form.

Since the propagation delay D of inverters S1–SN is a function of the power supply voltage VPLL supplied in common to all the inverters S1–SN, the frequency of signals T1–TN (1\2ND) can be controlled by adjusting the voltage of VPLL. A reference oscillator 18 produces an output clock signal (CLOCK) supplied as input to a phase lock controller 20. A delay circuit 22 delays tap signal T1 to provide a second input T1X to phase lock controller 20. Controller 20 includes a phase detector 20A comprising CLOCK to T1X and driving a charge pump 20B charging a capacitor 20C to produce the VPLL signal controlling the frequency of tap signals T1–TN. When CLOCK leads T1X, controller 20 increases the voltage of VPLL to increase the frequency of tap signals TA(1)–TA(N). When CLOCK lags T1X, controller 20 decreases the voltage of VPLL to decrease tap T1–TN signal frequency. Thus controller 20 phase locks signal T1X to CLOCK. Since T1X is derived from T1, all tap signals TA(1)–TA(N) are frequency locked to CLOCK.

The timing signal generator 10 includes a multiplexer 24 for selecting any one of the tap signals TA(1)–TA(N) as the TIMING signal output. A logic circuit 28 clocked by the CLOCK signal receives an externally generated START signal 14 and controls the tap signal selection made by multiplexer 24 in a manner indicated by input programming data (DATA) supplied to logic circuit 28. Logic circuit 28 may be programmed to switch multiplexer 24 "on-the-fly" so that multiplexer 24 changes its tap signal selection from time to time according to a predetermined pattern. Depending on the switching pattern of multiplexer 24, the TIMING signal may provide one or more pulses at a predetermined times after START signal 14 is asserted. The TIMING signal pulses may be periodic with a frequency that differs from that of the CLOCK signal or may be irregularly spaced.

The delay provided by delay circuit 22 is set equal to the propagation delay of the selected tap signal through multiplexer 24 so that TIMING signal pulses will have predictable phase relationships with CLOCK signal pulses. For example, if multiplexer 24 always selects tap T1, then the TIMING signal will have the same phase as signal T1X at the input of phase lock controller 20. Since T1X is phase locked to CLOCK, TIMING signal pulses will also be phase locked to the CLOCK signal. If multiplexer 24 selects any other tap signal T2–TN, the TIMING signal pulses will be phase shifted from CLOCK signal pulses by a known amount, the phase difference between T1 and the selected tap signal.

Although oscillator 16 is frequency locked to the stable CLOCK signal, the CLOCK signal is only loosely coupled to the oscillator output signal T1 through phase controller 20. The delay inherent in the feedback loop limits the ability of the feedback loop to quickly dampen oscillations in the phase of the tap signals T1–TN in response to system noise. Such oscillation ("jitter") in tap signal phase limits the timing resolution that may be achieved. Although we can increase the number N of stages in the ring to improve timing resolution, at some point signal jitter overwhelms the nominal phase differences between adjacent taps and further increases in N provide no increase in timing resolution. Also any variation between the delay provided by delay circuit 22 from the delay provided by multiplexer 24 can cause an error in the timing of pulses of the TIMING signal. Such variation can result from temperature or IC process variations between the devices forming circuit 22 and those forming multiplexer 24.

What is needed is a timing signal generator for producing a highly stable timing signal having pulses of adjustable timing relative to pulses of a stable reference clock.

SUMMARY OF THE INVENTION

In accordance with one aspect of the present invention, an apparatus for generating a timing signal having pulses of adjustable timing relative to pulses of a stable reference clock includes a retriggerable voltage controlled oscillator (RVCO) for producing a set of N periodic tap signals (TA(1)–TA(N)). The TA(1)–TA(N) signals are frequency locked to a stable clock signal (CLOCK1) produced by a reference oscillator. The TA(1)–TA(N) tap signals each have a 50% duty cycle and are distributed in phase so as to resolve time into regular intervals, each 1/Nth of the period of the CLOCK1 signal. The RVCO is not free running but rather is directly retriggered on each cycle of the CLOCK1 signal so that phase jitter in the TA(1)–TA(N) signals is very low.

In accordance with another aspect of the invention, the timing signal generator includes a circuit for synthesizing the timing signal using the tap signals as time references for controlling timing of pulses in the timing signal. The timing signal synthesizer also produces a clock signal CLOCK3 having the same frequency as the TA(1) tap signal but which is delayed from TA(1) by the delay inherent in the signal processing path between the tap signals and the timing signal. A first phase lock loop controller compares CLOCK3 to a similarly delayed CLOCK1 signal and adjusts the RVCO oscillation rate to bring TA(1) into phase with CLOCK1, thereby stabilizing the timing of the tap signal pulses and establishing a predictable phase relationships between CLOCK1 signals and the timing signal pulses.

In accordance with a further aspect of the invention, the timing signal path within the timing signal processor includes a delay circuit having a delay that is dynamically adjusted by a second phase lock loop controller. The second phase lock loop controller compares the CLOCK1 signal to the TA(1) signal and adjusts the delay of the delay circuit so as to phase lock TA(1) to the CLOCK1 signal. This adjustment cancels out any changes in the delay inherent in timing signal path that may be due to temperature or process variations that would otherwise affect the timing signal and the CLOCK1 signal.

It is accordingly an object of the invention to provide a timing signal generator producing a highly stable timing signal having pulses of adjustable timing relative to pulses of a reference clock.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Figure 2A:
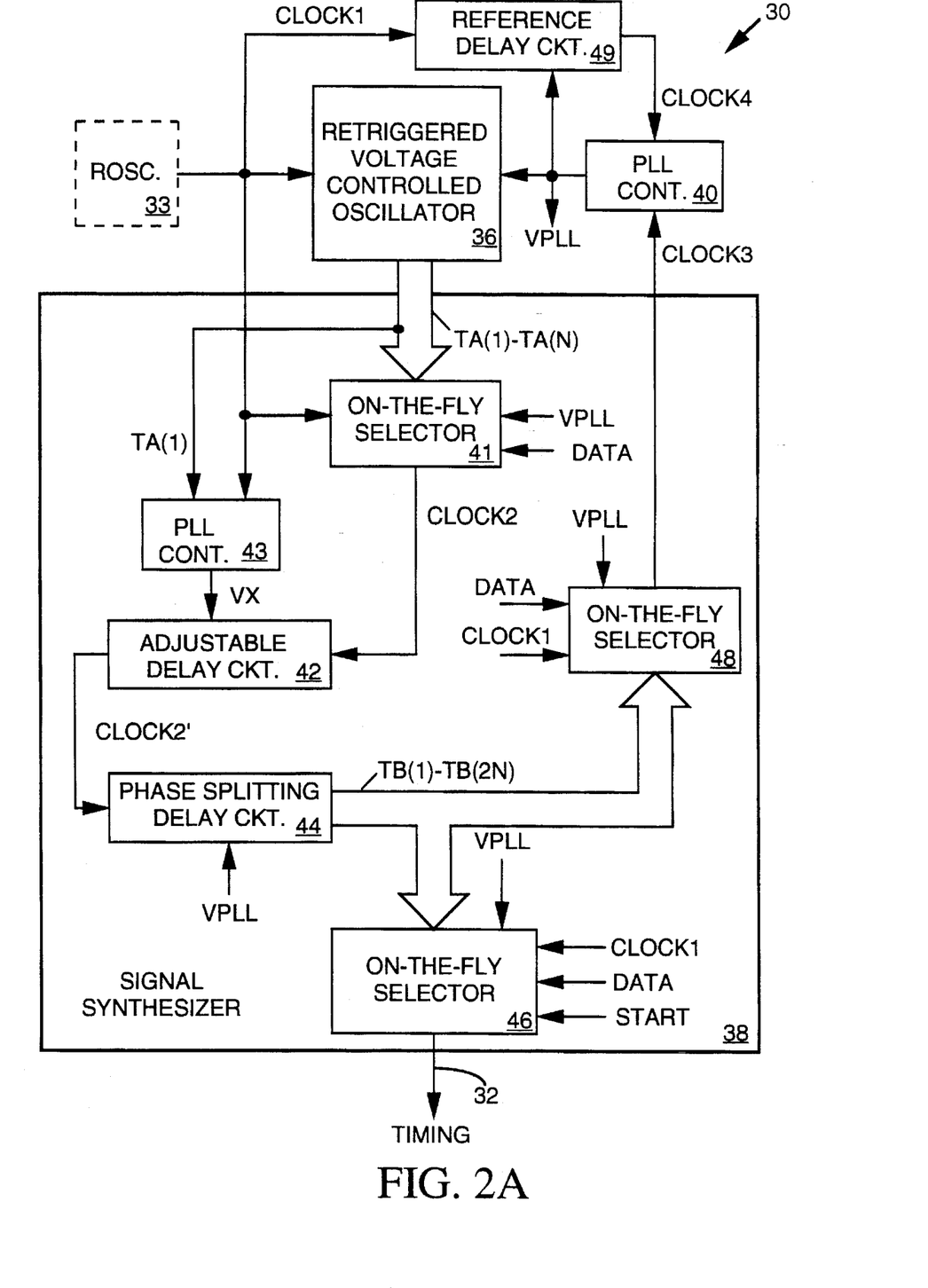
FIG. 2A illustrates in block diagram form a timing signal generator in accordance with the present invention.

FIG. 2A illustrates in block diagram form a timing signal generator 30 in accordance with the present invention. Signal generator 30 produces an output timing signal (TIMING) consisting of one or more precisely timed pulses useful by other circuits for controlling the timing of an event or a series of events to occur following assertion of a START signal provided as input to generator 30. Generator 30 is programmed by input data (DATA) to provide TIMING signal pulses commencing and ending at adjustable times following assertion of an input START signal. The pulses are of adjustable duration and may be periodic or irregularly spaced. Generator 30 uses an input clock signal (CLOCK1) as a reference for controlling the timing of the TIMING signal pulses. The CLOCK1 signal may be produced, for example by a highly stable 50 MHz crystal oscillator.

Timing signal generator 30 includes a retriggerable, voltage controlled oscillator (RVCO) 36, a signal synthesizer 38, an RVCO controller circuit 40, and a reference delay circuit 49. RVCO 36 receives the CLOCK1 signal from ROSC 33 and a phase lock loop control signal (VPLL) from RVCO controller 40 and produces a set of N periodic output tap signals TA(1)–TA(N). RVCO controller 40 is a conventional phase lock loop controller for producing an output signal VPLL proportional to the integral of the phase difference between its input signals CLOCK4 and CLOCK3. The reference delay circuit 49 delays the CLOCK1 signal to produce CLOCK4. The signal synthesizer 38 synthesizes the CLOCK3 signal using the TA(1)–TA(N) signals as timing references. CLOCK3 has the same frequency as the TA(1) tap signal but is delayed from TA(1) by the same delay as CLOCK4 is delayed from CLOCK1. Controller 40 controls the level of VPLL so as to phase lock CLOCK3 to CLOCK4. Since CLOCK3 is phase shifted from TA(1) by the same amount as CLOCK4 is phase shifted from TA(1), the VPLL signal also phase locks the TA(1) signal to CLOCK1.

While TA(1) tap signal is phase locked to the CLOCK1 signal, the TA(2)–TA(N) tap signals, though frequency locked to CLOCK1, are distributed in phase by regular intervals of 1/Nth of the period of the CLOCK1 signal. Being phase shifted one from another in this manner, pulses of the TA(1)–TA(N) tap signals can be used as timing references subdividing the period of the CLOCK1 signal into N equal parts. Signal synthesizer 38 accurately selects the timing of the leading and trailing edges of each pulse of the synthesized TIMING signal using the TA(1)–TA(N) signals as timing references. Thus signal synthesizer 38 can control the pulse timing and duty cycle of TIMING signal with a resolution equal to 1/Nth of the CLOCK1 signal period.

Synthesizer 38 includes a first on-the-fly selector 41 for producing a second clock signal (CLOCK2) of a desired adjustable frequency (e.g. 25–50 MHz) by selecting pulse edges of various TA(1)–TA(N) signals to control the timing of pulse edges of the CLOCK2 signal. The CLOCK2 signal passes into an adjustable delay circuit 42 to produce a delayed clock signal CLOCK2'. A phase lock loop controller 43 adjusts the delay of circuit 42. (The purpose of this adjustable delay is discussed herein below.) The CLOCK2' signal passes into a phase splitting delay circuit 44 producing a second set of tap signals TB(1)–TB(2N). The TB(1)–TB(2N) signals have the same frequency as the CLOCK2' signal but their phases are evenly distributed. The TB(1)–TB(2N) signals are supplied to another on-the-fly selector 46 synthesizing the desired TIMING signal using one or more of the TB(1)–TB(2N) signals as a timing references.

The timing signal generator 30 includes another on-the-fly selector 48 synthesizing the CLOCK3 signal using the TB(1)–TB(2N) signals as timing references. The CLOCK3 signal has the same frequency as TA(1) but is delayed from TA(1) by the amount of processing delay inherent in the signal path through devices 41, 42, 44 and 48. Since reference delay circuit 49 provides the same delay between CLOCK1 and CLOCK4, when PLL lock controller 40 phase locks CLOCK3 to CLOCK4 it also phase locks TA(1) to CLOCK1. It is, however, important to note that controller 40 phase locks TA(1) to CLOCK1 with an accuracy dependent upon on accurately reference delay circuit 49 duplicates the signal path delay through devices 41, 42, 44 and 48. Since the delay of circuit 49 is fixed, any variation in the signal path delay through devices 41, 42, 44 and 48 would cause a phase shift between TA(1) and CLOCK1. Therefore, in accordance with the present invention, PLL controller 43 monitors the phase difference between TA(1) and CLOCK1 and dynamically adjusts the delay through delay circuit 42 to ensure that the total signal path delay through devices 41, 42, 44 and 48 remains equal to the delay through the reference delay circuit 49.

Figure 2B:
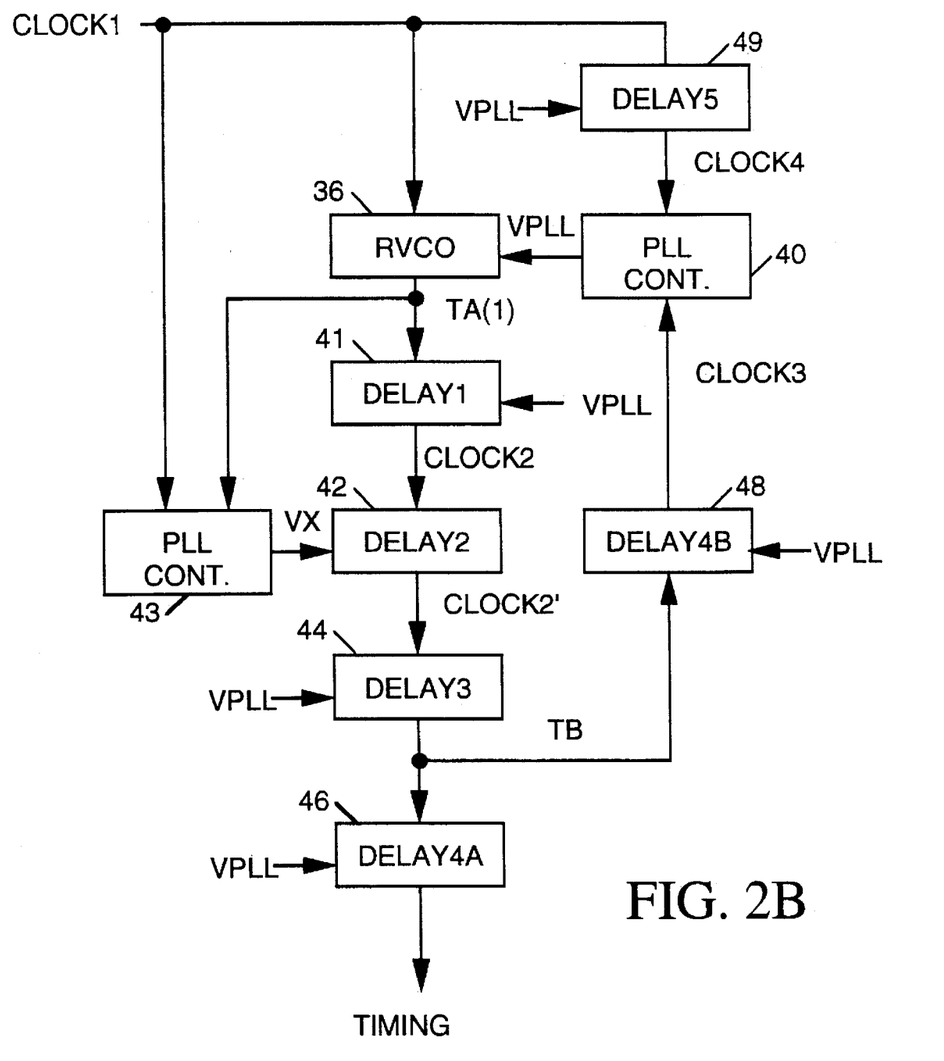
FIG. 2B illustrates in block diagram form time delays in the signal timing paths through various elements of the timing signal generator of FIG. 2A.

FIG. 2B is a block diagram illustrating time delays associated with the timing signal generator of FIG. 2A. Referring to FIGS. 2A and 2B, the signal path delay through selector 41 is represented as DELAY1. The signal path delays of circuits 42, 43, 46, 48 and 49 are represented as delays DELAY2, DELAY3, DELAY4A, DELAY4B and DELAY5, respectively. The values of DELAY1, DELAY3, DELAY4A and DELAY4B and DELAY5 vary in inverse relation to the voltage of the VPLL signal produced by RVCO controller 40. The value of DELAY2, the delay provided by adjustable delay circuit 42, varies inversely with the VX signal produced by phase lock loop controller 43 of FIG. 2A. The signal paths through selectors 46 and 48 are similar and therefore DELAY4A and DELAY4B are equal. Thus the processing delay of the "timing signal path" through devices 41, 42, 44 and 46 will be equal to the "reference signal path" through devices 41, 42, 44 and 48.

As mentioned above reference delay circuit 49 is designed so that DELAY5 is equal to the sum of the nominal values of DELAY1, DELAY2, DELAY3, and DELAY4A (or DELAY4B). The devices that produce these delays are made up of transistor gates having signal propagation speeds controlled by their power supplies. The VPLL signal supplies power to all gates in the timing signal path except those forming adjustable delay circuit 42. These gates obtain their power supply VX from controller 43. The reference delay circuit 49 is suitably a series of inverter gates that the CLOCK1 signal must pass through to become the CLOCK4 signal. Each inverter gate in the series corresponds to, and is similar in construction to, a separate gate in the timing (or reference) signal path through devices 41, 42, 44 and 46 (or 48). If the VX signal voltage were equal to the VPLL signal voltage we might expect the reference path delay through circuit 49 to match the timing signal path delay through devices 41, 42, 44 and 46 (or 48) since each path has the same number and type of gates and since they all would have the same power supply voltage level. However due to temperature and process variations between the various components, the actual signal propagation rate in gates forming devices 41, 42, 44 or 46 (or 48) may differ from the propagation rate of corresponding gates forming the reference delay circuit 49. Without compensating for such differences, the delay (DELAY5) through reference delay circuit 49 would not match the timing or reference signal path delay through devices 41, 42, 44 and 46 (or 48). In such event, TA(1) would not be in phase with the CLOCK1 signal and TIMING signal pulses would not occur at the expected times.

The adjustable delay circuit 42 is included to provide the necessary compensation to make sure that the timing or reference signal path delay through devices 41, 42, 44 and 46 (or 48) matches the reference delay circuit 49 delay (DELAY5). Delay circuit 42 is suitably a series of inverter gates through which the CLOCK2 signal must pass to become CLOCK2'. While all other gates in the timing signal path derive their power from VPLL, the gates within delay circuit 42 derive their power from the VX output of controller 43. The propagation rate through those inverters depends on VX. If the timing signal and reference path delays differ due to temperature or IC process variations, PLL controller 40 will seek an equilibrium wherein TA(1) is shifted in phase from CLOCK1 by an unpredictable amount. Controller 43 remedies this problem. Controller 43 is a conventional VCO controller circuit for monitoring the phase difference between the CLOCK1 and TA(1) signals and controlling VX so as to bring them back into phase. If DELAY5 exceeds the timing signal path delay, then TA(1) will lag CLOCK1. In such event controller 43 decreases VX so as to increase the timing signal path delay through delay circuit 42. Conversely, if DELAY5 is less than the timing signal path delay, then TA(1) will lead CLOCK1 and controller 43 will increase VX so as to decrease the timing signal path delay through delay circuit 42. In either case controller 40 will respond to a change in timing path delay by bringing TA(1) back into phase with CLOCK1.

Thus the timing signal generator 30 of FIG. 2A involves two phase lock loops. Both loops seek to phase lock the TA(1) signal to the CLOCK1 signal. The "primary" loop involving controller 40 indirectly monitors the phase difference between CLOCK1 and TA(1) (by monitoring CLOCK4 and CLOCK3) and directly adjusts the phase of TA(1) relative to CLOCK1 by adjusting VPLL. The "secondary" loop involving controller 43 directly monitors the phase relationship between CLOCK1 and TA(1) and indirectly adjusts their phase relationship by adjusting the timing signal path delay. The two phase lock loops work together to minimize tap signal jitter.

Figure 3A:
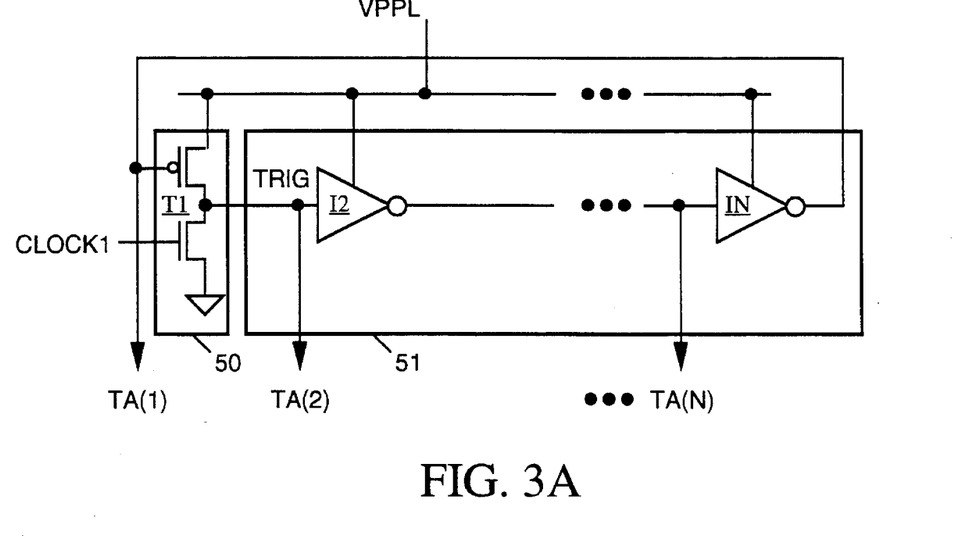
FIG. 3A illustrates in block diagram form, the N-stage retriggered, voltage controlled oscillator of FIG. 2A.

FIG. 3A illustrates a suitable implementation of the N-stage retriggered, voltage controlled oscillator 36 of FIG. 2A in greater detail. RVCO 36 includes a trigger circuit 50 (stage I1) and an N–1 stage delay circuit 51 formed by a set of inverters (stages I2–IN). Those skilled in the art will appreciate that stages I1–IN may be implemented using many types of transistor technologies such as CMOS, TTL and various logic systems including differential logic. For the circuit of FIG. 3A to function properly, N must be an odd number. The trigger signal output (TRIG) of trigger circuit 50 is tied to the input of inverter I2. The inverters I2–IN are connected in series with the output of each inverter being connected to the input of the next. The output of the last inverter stage IN is fed back to an inverting input of trigger circuit 50. The CLOCK1 signal is tied to a non-inverting input of trigger circuit 50.

Delay circuit 51 functions as a phase distribution circuit, generating a succession of signal pulses in response to each pulse of a trigger signal (TRIG) from trigger circuit 50. The successive pulses are shifted in time by regular intervals and each pulse is conveyed by a separate output tap signal TA(1)–TA(N). The TA(1)–TA(N) tap signals appear at the inputs of stages I1–IN. The phase shift interval between pulses is equal to the signal propagation delay of stages I1–IN. Stages I1–IN all have the same signal propagation delay, a function of the VPLL signal forming the power supply to each oscillator stage I1–IN.

Figure 3B:
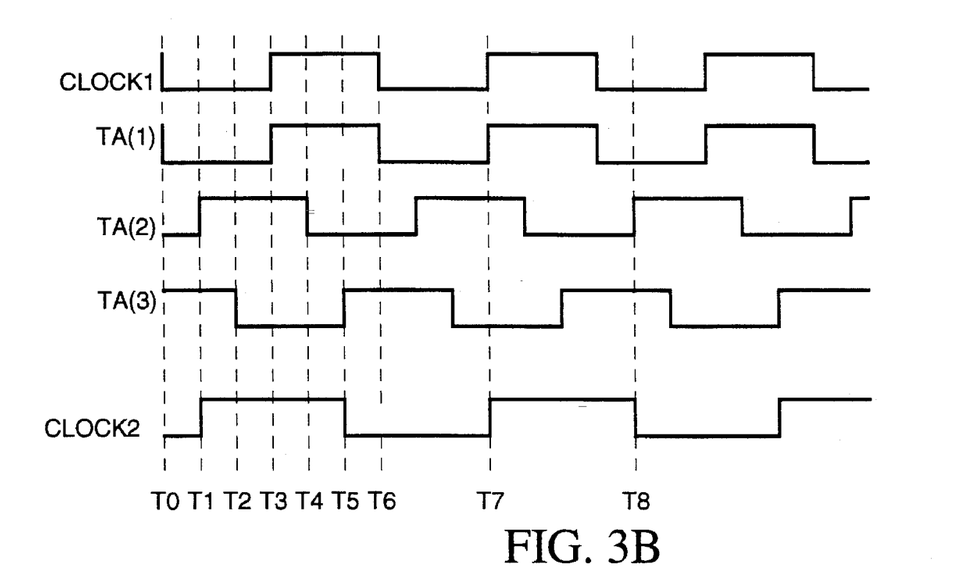
FIG. 3B is a timing diagram illustrating the operation of retriggered, voltage controlled oscillator FIG. 2A in a simplified example where N is three.

FIG. 3B is a timing diagram illustrating the operation of RVCO 36 of FIG. 3A in a simplified case where N is 3. As discussed below the VPLL signal voltage is controlled so that the propagation delay of each stage of delay circuit 51 is one sixth of the period of CLOCK1. This frequency locks the TA(1)–TA(N) signals to the CLOCK1 signal with the TA(1) tap signal being phase locked to CLOCK1. The remaining TA(1)–TA(N) signals are phase shifted from the CLOCK1 signal by differing amounts. Since N is three in the example of FIG. 3B, the leading (or trailing) edges of the TA(1)–TA(N) signals serve to divide each CLOCK1 cycle into three equal periods. If N were, for example 31, the leading edges of the TA(1)–TA(N) signal would divide each CLOCK1 cycle into 31 equal periods. As illustrated in FIG. 3B, at time T0 CLOCK1 and TA(1) low. Thereafter, at time T1, signal TA(2) goes high. The time delay between times T0 and T1 represents the propagation time delay of the trigger circuit 50. At time T2, TA(3) goes low in response to the change in TA(2) state at time T1. The delay in response between times T1 and time T2 represents the propagation delay of stage I2. By time T6, when the CLOCK1 signal goes high again, each of the three stages has switched twice, the CLOCK1 period T0–T6 being equal to 2N times the delay of a single stage.

Figure 4:
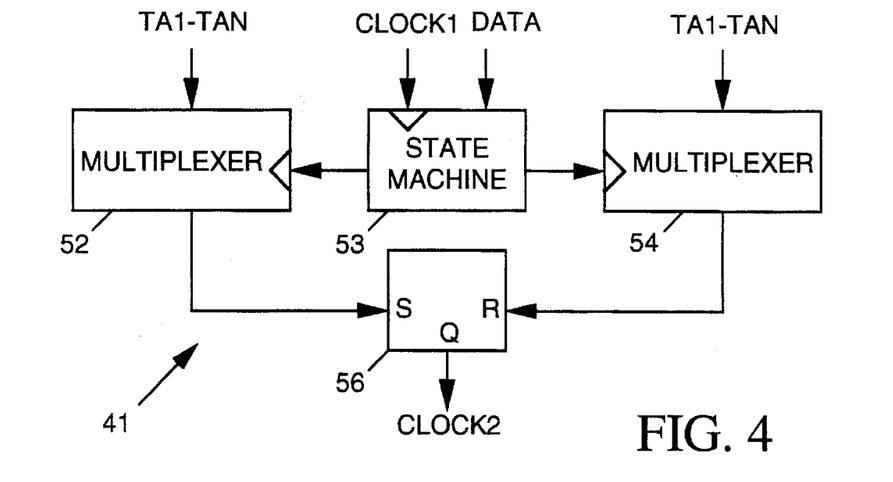
FIG. 4 illustrates in block diagram form the on-the-fly selector of FIG. 2 for synthesizing the CLOCK2 signal from the TA signals.

FIG. 4 illustrates the on-the-fly selector 41 of FIG. 2 for synthesizing the CLOCK2 signal from the TA signals. Selector 41 includes a state machine 53, a pair of multiplexers 52 and 54 and a type SR flip-flop 56. The TA signals are provided as inputs to both multiplexers 52 and 54. The output of multiplexer 52 controls the set input of flip-flop 56 while the output of multiplexer 54 controls its reset input. State machine 53, programmed by externally supplied data and clocked by the CLOCK1 signal, controls the switching states of multiplexers 52 and 54. At the beginning of each cycle of the CLOCK1 signal, state machine 53 switches multiplexers 52 and 54 to select the desired TA tap signals to control the set and reset inputs of flip-flop 56 during the remaining portion of the CLOCK1 cycle. State machine 53 could, for example, be implemented as a random access memory addressed by a counter clocked by CLOCK1. The memory stores the appropriate output data patterns for each successive CLOCK1 cycle at successive addresses and outputs the appropriate patterns as the counter output advances. This and other designs for programmable state machines capable of producing sequences of data patterns in response to a clock signal are well known to those skilled in the art and are not further detailed herein.

Referring again to FIG. 3B, selector 41 can synthesize, for example, a CLOCK2 signal having a period one third longer than the CLOCK1 period. At time T0, state machine 53 of FIG. 4 selects tap TA(2) to control the set input of flip-flop 56 and selects tap TA(3) to control the reset input. At time T1, signal TA(2) sets flip-flop 56 and at time T5 signal TA(3) resets it. At time T6, on the next leading edge of CLOCK1, state machine 53 selects TA(1) to control the set input of flip-flop 56 and selects TA(2) to control the reset input thereby defining the leading and trailing edges of the next pulse of the CLOCK2 signal at times T7 and T8, respectively. (It should be noted that the CLOCK2 signal will actually be delayed by DELAY1 from that illustrated in FIG. 3B where DELAY1 is the propagation delay of the signal path through multiplexers 52 and 54 and flip-flop 56.) Thus by properly programming the output data patterns produced by state machine 53, a CLOCK2 signal having a period ranging, for example, from 1 to 2 times the period of CLOCK1 can be synthesized, with a resolution of (1/N)th of the CLOCK2 period.

Figure 5:
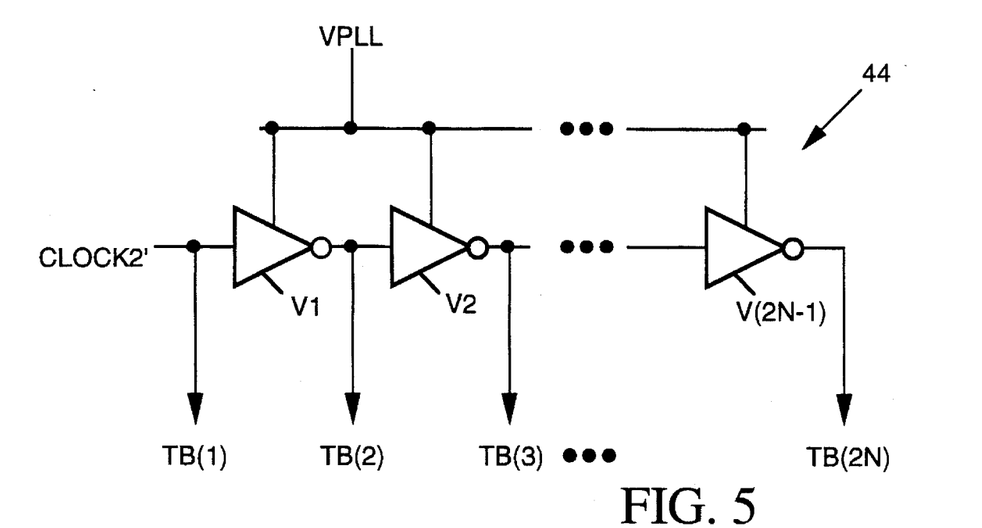
FIG. 5 illustrates in block diagram form the phase splitting delay circuit of FIG. 2A.

Referring to FIG. 5 illustrating the phase splitting delay circuit 44 of FIG. 2A in block diagram form, delay circuit 44 comprises a set of inverter stages V(1) though V(2N–1) connected in series. The first stage V(1) receives the CLOCK2' signal, which also servers as the TB(1) tap signal. The remaining TB(2)–TB(2N) tap signals are taken at outputs of stages V(1)–V(2N–1). The stages of delay circuit 44 are identical to the stages of delay circuit 51 of RVCO 36 of FIG. 3A and they are controlled by the power supply signal VPLL. Thus the delay of each stage of delay circuit 44 of FIG. 5 is the same as the stage delay of circuit 51, and the phase difference between tap signals TB(1)–TB(2N) is 1/Nth of one cycle of the CLOCK1 signal. Since the period of CLOCK2' may be twice as long as the period of CLOCK1, delay circuit 44 needs to produce twice as many tap signals as oscillator 36 in order to divide the CLOCK2' signal with the same resolution as the TA(1)–TA(N) signals divide the CLOCK1 signal. When the CLOCK2' signal has a period that is less than twice that of CLOCK1, some of the TB(1)–TB(2N) signal inputs to selector 46 are redundant.

Selector 48 of FIG. 2A is similar to selector 41 of FIG. 4 but is programmed to produce the CLOCK3 signal having the same frequency as tap signal TA(1) but delayed therefrom by the sum of delays through devices 41, 42, 44 and 48. Each successive pulse of the TA(1) tap signal leads a pulse of at least one of the TB tap signals by the amount of the signal path delay through devices 41, 42 and 43, even though the TB signals may have a frequency that differs from TA(1). Selector 48 is programmed to synthesize the CLOCK3 signal from the TB signals.

As mentioned above, the signal paths provided by selectors 46 and 48 are identical and the delay through selector 46 is equal to the delay through selector 48. Therefore the timing signal path delay between TA(1) and the TIMING signal is also equal to DELAY5. The purpose of timing circuit 30 is, of course, to produce a TIMING signal commencing at some known, adjustable time in relation to the first pulse of the CLOCK1 signal occurring after assertion of the START signal. Selector 46 can produce an output TIMING signal pulse at any time following a particular CLOCK1 signal pulse, for example the first CLOCK1 signal pulse occurring after a START signal pulse. However there are two limitations in such timing. First, the TIMING signal pulse must lag the CLOCK1 signal pulse by at least DELAY5, the inherent delay of the timing signal path. Second, selector 46 can adjust the timing of each TIMING signal pulse with a resolution 1/Nth of the CLOCK1 period where N is the number of stages of the oscillator 36 of FIG. 2A.

Figure 6:
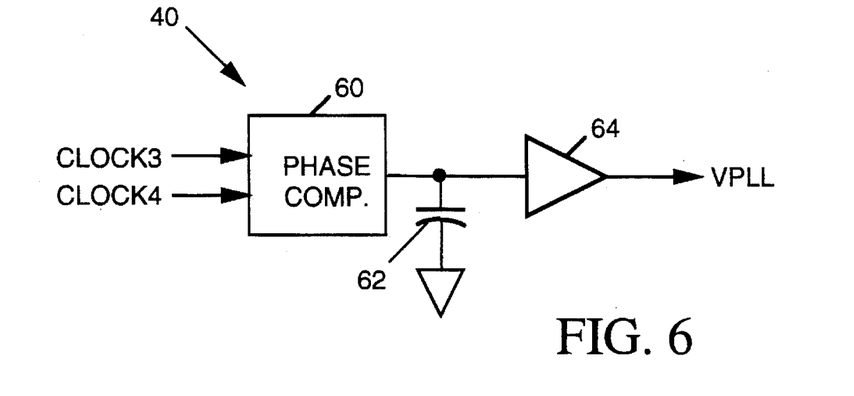
FIG. 6 illustrates in block diagram form the PLL controller producing a CLOCK2 signal.

FIG. 6 illustrates in block diagram form PLL controller 40 of FIG. 2A. A phase comparator 60 charges or discharges a capacitor 62 at a rate proportional to the phase difference between CLOCK3 and CLOCK4. An amplifier 64 amplifies the voltage across capacitor 62 to produce the VPLL signal.

Figure 7:
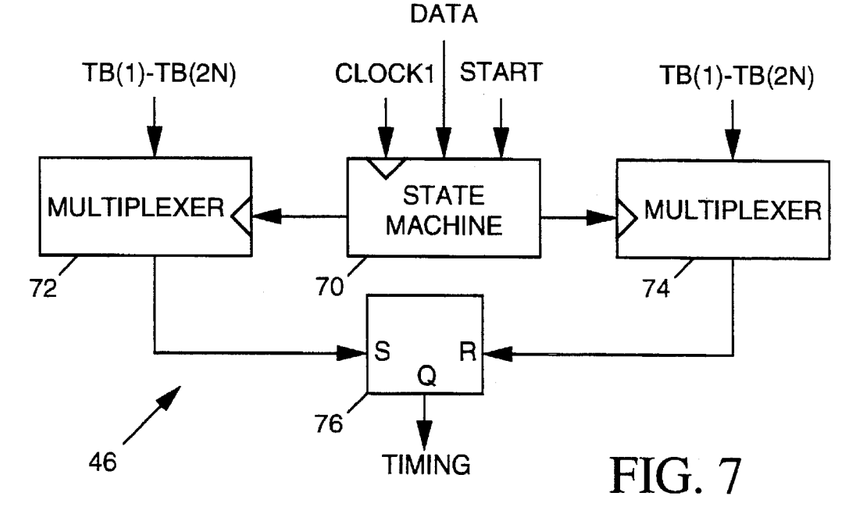
FIG. 7 illustrates in block diagram form the on-the-fly selector of FIG. 2 producing the TIMING signal.

FIG. 7 illustrates on-the-fly selector 46 of FIG. 2 in more detailed block diagram form. Selector 46 includes a conventional state machine 70, multiplexers 72 and 74 and a flip-flop 76 operating in a manner similar to that of selector 41. Selector 46 produces the TIMING signal at the output of flip-flop 76 by selecting pulses of the TB(1)–TN(2N) signals to set and reset flip-flop 76 according to sequences of data patterns stored in state machine 70. State machine 70 includes an additional START signal input enabling it to respond to a START signal pulse by branching between stored sequences of data patterns.

Figure 8:
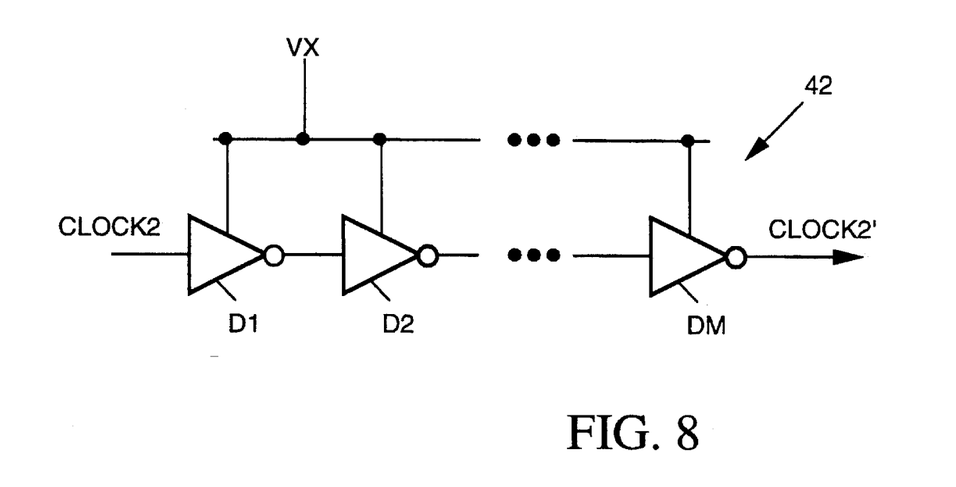
FIG. 8 illustrates in block diagram form the adjustable delay circuit of FIG. 2A.

FIG. 8 illustrates adjustable delay circuit 42 of FIG. 2A in block diagram form. Delay circuit 42 consists of a set of M inverter stages D1–DM connected in series and supplied by the VX signal. The signal propagation speed of each stage varies with VX. The CLOCK2 signal is applied to stage D1 and the CLOCK2' signal appears at the output of stage DM.

Figure 9:
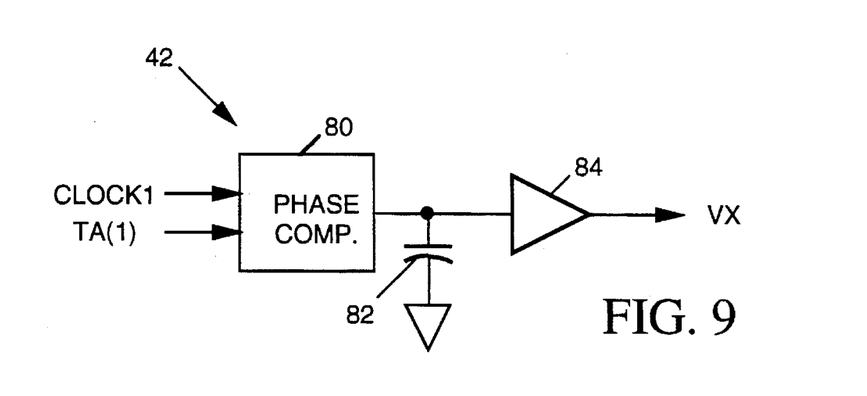
FIG. 9 illustrates in block diagram form the phase lock loop controller of FIG. 2A that produces the VX signal.

FIG. 9 illustrates phase lock loop controller 43 of FIG. 2A. A phase comparator 80 charges or discharges a capacitor 82 in proportion to the phase difference between CLOCK1 and TA(1). An amplifier 84 amplifies voltage across capacitor 82 to produce the VX signal.

Thus has been described a timing signal generator employing a retriggerable voltage controlled oscillator to produce a set of tap signals used to control the timing of pulses of an output timing signal with high resolution and predictability. The signal generator uses phase lock loops to control the oscillator so that signal timing is predictable and stable. While the forgoing specification has described preferred embodiment(s) of the present invention, one skilled in the art may make many modifications to the preferred embodiment without departing form the invention in its broader aspects. The appended claims therefore are intended to cover all such modifications as fall within the true scope and spirit of the invention.

I claim:

1. A triggered oscillator for producing a plurality of tap signals frequency locked to an input first clock signal and evenly distributed in phase, comprising:

phase distribution means for generating said tap signals including a reference tap signal, said phase distribution means producing in response to each pulse of an input trigger signal a succession of signal pulses having adjustable interval between each pulse of said succession, the interval being adjusted in response to a control signal supplied as input to said phase distribution means, each signal pulse of the succession being conveyed by a separate one of said tap signals, a last pulse of the succession being conveyed by said reference tap signal;

a trigger circuit, receiving said input first clock signal, for generating and transmitting said trigger signal to said phase distribution means, the trigger circuit producing a pulse in the trigger signal upon each concurrence of a pulse in said input first clock signal with a pulse in said reference tap signal; and control means generating and supplying said control signal as input to said phase distribution means for adjusting said interval between pulses of said succession such that said tap signals are frequency locked to said input first clock signal.

2. The triggered oscillator in accordance with claim 1 wherein said phase distribution means comprises a series of logic stages, including a first logic stage receiving said trigger signal as an input signal, wherein each logic stage processes a separate input signal to produce a separate output tap signal, wherein each logic stage other than a last of said logic stages passes its output tap signal as an input to a next logic stage of said series, wherein said last logic stage processes its input signal to produce said reference tap signal, and wherein said adjustable interval is a function of a processing time required by each of said logic stages to process its input signal to produce its output tap signal.

3. The triggered oscillator in accordance with claim 2 wherein each of said logic stages inverts its input signal to produce its output tap signal.

4. The triggered oscillator in accordance with claim 2 wherein said processing time is adjusted in accordance with a magnitude of said control signal generated by said control means and supplied in common to each of said logic stages.

5. The triggered oscillator in accordance with claim 4 wherein said control signal magnitude is a function of a phase relation between said input first clock signal and said last tap signal.

6. A timing signal generator for producing a timing signal in response to an input first clock signal, comprising:

phase distribution means for generating a plurality of tap signals including a reference tap signal, said phase distribution means producing in response to each pulse of an input trigger signal a succession of signal pulses having adjustable interval between each pulse of said succession, the interval being adjusted in response to a control signal supplied as input to said phase distribution means, each signal pulse of the succession being conveyed by a separate one of said tap signals, a last pulse of the succession being conveyed by said reference tap signal;

a trigger circuit, receiving said input first clock signal, for generating and transmitting said trigger signal to said phase distribution means, the trigger circuit producing a pulse in the trigger signal upon each concurrence of a pulse in said input first clock signal with a pulse in said reference tap signal;

control means generating and supplying said control signal as input to said phase distribution means for adjusting said interval between pulses of said succession such that said tap signals are frequency locked to said input first clock signal; and signal synthesizing means for generating said timing signal, controlling timing of leading and trailing edges of each pulse of said timing signal in adjustable relation to timing of edges of pulses of selected ones of the tap signals generated by the phase distribution means.

7. The timing signal generator in accordance with claim 6 wherein said signal synthesizing means also generates a second clock signal, controlling timing of pulses of the second clock signal in relation to timing of pulses of selected ones of the tap signals, and wherein the control means adjusts said interval in response to a phase relationship between the first and second clock signals.

8. The timing signal generator in accordance with claim 7 wherein said phase distribution means comprises a series of logic stages, including a first logic stage receiving said trigger signal as an input signal, wherein each logic stage processes its input signal to produce an output tap signal and wherein each logic stage other than a last of said logic stages passes its output tap signal as an input to a next stage of said series, wherein said last logic stage processes its input signal to produce said reference tap signal, and wherein said adjustable interval comprises a processing time required by each of said logic stages to process its input signal to produce its output tap signal.

9. The timing signal generator in accordance with claim 8 wherein each of said logic stages inverts its input signal to produce its output tap signal.

10. The timing signal generator in accordance with claim 8 wherein said processing time is adjusted in accordance with a magnitude of a control signal generated by said control means and supplied in common to each of said logic stages.

11. The triggered oscillator in accordance with claim 10 wherein said control signal magnitude is a function of a phase relation between said first and second clock signals.

12. A timing signal generator for producing a timing signal in response to an input first clock signal, comprising:

phase distribution means for generating a plurality of tap signals including a reference tap signal, said phase distribution means producing in response to each pulse of an input trigger signal a succession of signal pulses having adjustable interval between each pulse of said succession, the interval being adjusted in response to a control signal supplied as input to said .phase distribution means, each signal pulse of the succession being conveyed by a separate one of said tap signals, a last pulse of the succession being conveyed by said reference tap signal;

a trigger circuit, receiving said input first clock signal, for generating and transmitting said trigger signal to said phase distribution means, the trigger circuit producing a pulse in the trigger signal upon each concurrence of pulses in said input first clock signal and said reference tap signal;

signal synthesizing means for generating said timing signal and a second clock signal, said signal synthesizing means timing pulses of said timing signal in relation to pulses of selected ones of the tap signals generated by the phase distribution means;

delay means for delaying said input first clock signal by a reference delay time to produce a fourth clock signal; and phase controller means for adjusting said interval to minimize a phase difference between said third and fourth clock signals.

13. The timing signal generator in accordance with claim 12 wherein a processing time required for said signal synthesizing means to produce a pulse of said timing signal in response to a pulse of a selected one of said tap signals is adjustable, and wherein said signal synthesizing means includes means for adjusting said processing time so that said processing time is equal to said reference delay time of said delay means.

14. The timing signal generator in accordance with claim 12 wherein said means for adjusting adjusts said processing time in response to a phase difference between said input first clock signal and said reference tap signal.

15. A timing signal generator for producing a timing signal in response to an input first clock signal, comprising:

first phase distribution means for generating a plurality of first tap signals including a reference tap signal, said phase distribution means producing in response to each pulse of an input trigger signal a succession of signal pulses with an adjustable interval between each pulse of said succession, each signal pulse of the succession being conveyed by a separate one of said first tap signals, a last pulse of the succession being conveyed by said reference tap signal;

a trigger circuit for generating and transmitting said trigger signal to said first phase distribution means, the trigger circuit producing a pulse in the trigger signal upon each concurrence of a pulse in said input first clock signal with a pulse in said reference tap signal;

first selector means for generating a second clock signal, said first selector means timing pulses of said second clock signal in relation to pulses of selected ones of the first tap signals generated by the first phase distribution means;

adjustable delay means for delaying said second clock signal by an adjustable delay period to produce a delayed second clock signal;

second phase distribution means for generating a plurality of second tap signals each phase shifted by a unique amount by from said delayed second clock signal;

second selector means for generating said timing signal, said second selector means timing pulses of said timing signal in relation to pulses of selected ones of said second tap signals;

third selector means for generating a third clock signal, said third selector means timing pulses of said third clock signal in relation to pulses of selected ones of the second tap signals generated by the second phase distribution means;

delay means for delaying said input first clock signal by a reference delay time to produce a fourth clock signal; and phase controller means for adjusting said interval to minimize a phase difference between said third and fourth clock signals.

16. The timing signal generator in accordance with claim 15 further comprising means for adjusting said reference delay time to minimize a phase difference between said input first clock signal and one of said first tap signals.

* * * * *